United States Patent [19]

Libove et al.

[11] Patent Number: 4,574,240

[45] Date of Patent: Mar. 4, 1986

[54] METHOD FOR FLOW MEASUREMENT USING NUCLEAR MAGNETIC RESONANCE

[75] Inventors: Joel M. Libove; Jerome R. Singer, both of Berkeley, Calif.

[73] Assignee: The Regents of the University of California, Berkeley, Calif.

[21] Appl. No.: 515,332

[22] Filed: Jul. 19, 1983

[51] Int. Cl.[4] .............................................. G01R 33/20
[52] U.S. Cl. ..................................... 324/306; 324/309; 128/653
[58] Field of Search ................ 128/653; 324/306, 309, 324/300, 307

[56] References Cited

U.S. PATENT DOCUMENTS

| | | | |
|---|---|---|---|
| 4,021,726 | 5/1977 | Garroway et al. | 324/309 |
| 4,297,637 | 10/1981 | Crooks et al. | 324/309 |
| 4,318,043 | 3/1982 | Crooks et al. | 324/309 |
| 4,442,404 | 4/1984 | Bergmann | 324/309 |
| 4,468,621 | 8/1984 | Hinshaw | 324/309 |

OTHER PUBLICATIONS

Crooks et al., "Nuclear Magnetic Resonance Whole--Body Imager Operating at 3.5 KGauss[1]", *Radiology*, vol. 143, No. 1, pp. 169–174, Apr. 1982.
Garroway, "Velocity Measurements in Flowing Fluids by NMR", *J. Phys.D: Appl. Phys.*, vol. 7, pp. L159–L163, Great Britain, 1974.

*Primary Examiner*—Reinhard J. Eisenzopf
*Assistant Examiner*—Kevin D. O'Shea
*Attorney, Agent, or Firm*—Townsend and Townsend

[57] ABSTRACT

Flow rates across a flat panel are determined in a non-intrusive manner by a novel technique involving the use of nuclear magnetic resonance (NMR). NMR signals requiring two or more time-spaced nuclear spin excitations are generated in a selective manner, whereby at least two of the excitations are confined to preselected tomographic regions which are non-coextensive in the direction of flow, i.e., at least a portion of each region lies outside the other. The relative positions of the volumes ranges from a partial overlap to a complete separation with a gap in between. Flow detection is derived from signals reflecting movement from one such region to the other during the interval of time between the excitations. Quantitative or qualitative flow data may be obtained, including full range velocity distributions for systems where a range of velocities is present. The process is readily combined with known NMR imaging techniques to provide a two-dimensional array of flow data.

40 Claims, 10 Drawing Figures

METHOD FOR FLOW MEASUREMENT USING NUCLEAR MAGNETIC RESONANCE

BACKGROUND OF THE INVENTION

1. Field of the Invention

This invention relates to the measurement of the velocity of a moving substance by the use of nuclear magnetic resonance (NMR). In particular, this invention relates to the quantitative determination of the flow rates of flowing fluids across a given plane, and of the position dependence of such flow rates in the plane itself. The method requires no intrusion into the fluids or the surrounding matter by other than a large amplitude static magnetic field, a small amplitude radio frequency electromagnetic field, and pulsed small amplitude magnetic field gradients. Although useful for a broad range of applications, this invention finds particular utility in the field of medical diagnostics, and most particularly in the detection and measurement of blood flow rates in living animals and humans.

2. Description of the Prior Art

Techniques for the study of flowing fluids using nuclear magnetic resonance have been known for approximately 25 years. Such techniques generally involve the use of downstream detectors, saturation followed by inflow of unsaturated material, or the imposition of a field gradient to cause measurable frequency and phase shifts.

Descriptions of these techniques are found in the following papers:

J. R. Singer, "Blood Flow Rates by Nuclear Magnetic Resonance Measurements", *Science* 130: 1652 (1959);

J. R. Singer, "Flow Rates by Nuclear and Electron Paramagnetic Resonance Methods", *J. Appl. Phys.*, 31: 125 (1960);

T. P. Grover, "NMR Flow Measurements", Ph.D. Dissertation, University of California, Berkeley, Dept. of Electrical Engineering and Computer Sciences (1971);

T. Grover et al., "NMR Spin-Echo Flow Measurements", *J. Appl. Phys.*, 42: 938 (1971);

A. N. Garroway, "Velocity Measurements in Flowing Fluids by NMR", *Journal of Physics D: Applied Physics*, 7: L159 (1974);

J. R. Singer et al., "Recent Measurements of Flow Using Nuclear Magnetic Resonance Techniques", *Modern Developments in Flow Measurement*, G. C. Clayton, ed., Peter Peregrinus Ltd., London (1972) pp. 38–48;

P. A. Jager, et al. "Novel Method for Determination of Flow Velocities with Pulsed Nuclear Magnetic Resonance", *Rev. Sci. Instr.*, 49(8), (1978);

D. W. Jones et al., "NMR in Flowing Systems", *Advances in Magnetic Resonance*, Volume 8, J. S. Waugh, ed., Academic Press, N.Y. (1976);

L. F. Latyshev et al., "Nuclear Magnetic Resonance in a Flowing Liquid", Moscow: Atomizdat (1968);

K. J. Packer, "The Study of Slow Coherent Molecular Motion by Pulsed Nuclear Magnetic Resonance", *Molecular Physics*, 17: 355 (1969);

J. S. Battocletti, et al., "NMR Detection of Low Magnetization Levels in Flowing Fluids", *I.E.E.E. Transactions on Magnetics*, Vol. Mag. 9: 451 (1973);

R. E. Halbach, et al., "Cylindrical Crossed-Coil NMR Limb Blood Flowmeter", *Rev. Sci. Inst.*, 50 (4), (1979);

O. C. Morse et al., "Blood Velocity Measurements in Intact Subjects", *Science*, 170: 440 (1970).

The known techniques vary in complexity and accuracy as well as in their ability to detect flow rate variations from point to point over a broad area. Unfortunately, they are incapable of focusing on a specific portion of a large area, such as a single blood vessel or a selected capillary region within a cross-section of the human body, to provide quantitative flow data specific to that vessel or region.

The imaging of entire cross-sections by NMR without the generation of flow data is also well known. Several methods of generating such images have been disclosed, but all are directed primarily at providing relative nuclear densities representative of the internal structure of the subject at the instant the imaging is performed. Publications disclosing such techniques include the following:

Lauterbur, "Image Formation by Induced Local Interaction: Examples Employing Nuclear Magnetic Resonance", *Nature*, 242: 190 (1973);

Damadian et al., "Focusing Nuclear Magnetic Resonance (FONAR), Visualization of a Tumor in a Live Animal", *Science*, 194: 1430-2 (1976);

Hinshaw et al., "Display of Cross-Sectional Anatomy by Nuclear Magnetic Resonance Imaging", *Brit. J. Radiol.*, 51: 273 (1978);

Kumar et al., "NMR Fourier Zeugmatography", *J. Mag. Res.*, 18: 69–83 (1975);

Mansfield et al., "Planar Spin Imaging by NMR", *J. Phys. C: Solid State Physics*, 9: L409–412 (1976);

Edelstein et al., "Spin Warp NMR Imaging and Applications to Human Whole-Body Imaging", *Phys. Med. Biol.*, 25(4): 751-6 (1980);

Crooks et al., "Nuclear Magnetic Resonance Whole-Body Imager Operating at 3.5 KGauss", *Radiology*, 143(1): 169-174 (1982);

Crooks et al., "Method and Apparatus for Rapid NMR Imaging of Nuclear Densities Within an Object", U.S. Pat. No. 4,318,043, Mar. 2, 1982;

Crooks et al., "Method and Apparatus for Mapping Lines of Nuclear Density Within an Object Using Nuclear Magnetic Resonance," U.S. Pat. No. 4,297,637, Oct. 27, 1981.

Summaries of the techniques described in the first five of these publications are given in each of the Crooks patents cited at the bottom of the list. Citations for further publications describing these and other techniques are also found in these patents.

If one could combine NMR flow measurement with NMR imaging to provide quantitative flow data as a function of position in a cross-sectional plane, one would be able to measure flow rates anywhere within an object without interfering with the flow itself. Such a technique would be a major advance in the technology of medical diagnostics since it would permit the determination of blood flow rates anywhere in the body without the use of injections or harmful radiations. One could safely and accurately determine in a direct in vivo manner, for example, the efficacy of blood additives for cardiovasoular problems. The treatment of full or partial arterial blockages by the use of catheterization, as a further example, could be advanced enormously by using such a technique to view both the artery and catheter and to measure the rate of blood flow there through at the same time. A wide range of other applications will be apparent to those skilled in the art.

SUMMARY OF THE INVENTION

The present invention resides in a novel method for obtaining quantitative volumetric flow rates of a moving substance by the use of nuclear magnetic resonance. NMR signals of the type requiring two or more time-spaced nuclear spin excitations are generated by confining the excitations to preselected tomographic regions at least two of which are not coextensive with each other in the direction of flow. For example, when two excitations are required, at least a portion of the volume in which each occurs lies outside the other. This ranges from a partial overlap of the volumes to a complete separation with a gap in between. The resulting signal provides an indication of the displacement of nuclei, and hence the flow of matter, from one volume to the next during the period of time between excitations. By appropriate sizing and positioning of the selected volumes, either qualitative or quantitative data on flow can be obtained. A distribution of velocities within a specified region can also be obtained by generating a series of signals, each differing from the others by one or more of the signal generation parameters, notably the length of the time period or the degree of offset or width of the gap between the volumes.

In a further aspect of the invention, the signal generation is combined with an imaging process, whereby NMR signals are differentiated according to their point of origin in a two-dimensional plane. Known two-dimensional NMR imaging techniques are used to break down the signals into a rectangular array of picture elements ("pixels"), the location of each pixel corresponding to the location in the tomographic slice of the nuclei from which the signal originated. A full array is generated for each signal mentioned in the preceding paragraph to provide a two-dimensional image indicating the presence or absence of flow at any point in the plane. This can also be extended into a distribution by generating a series of images, each differing from the others as described above. The result is readily converted by conventional techniques to flow rate information of a high degree of resolution without requiring access to the interior of the region.

DETAILED DESCRIPTION OF THE INVENTION AND THE PREFERRED EMBODIMENTS

Figure 1:
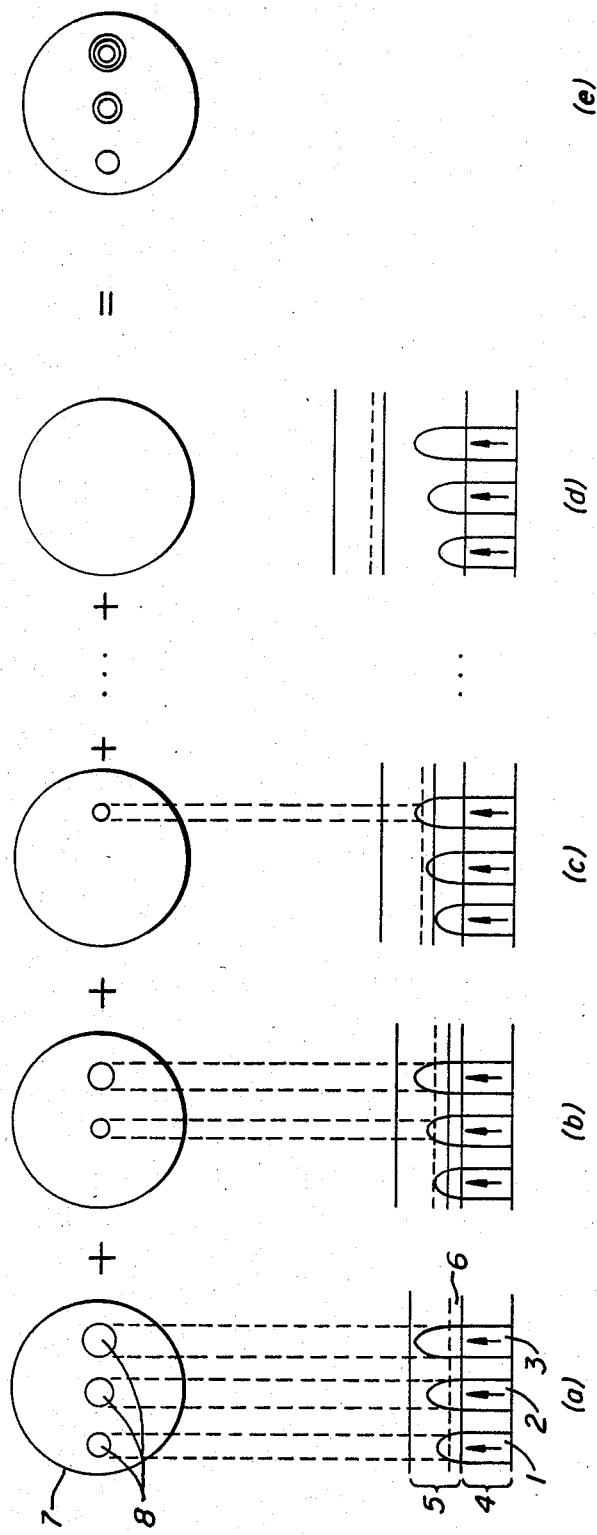
FIG. 1 is an illustration of one embodiment of the invention whereby a two-dimensional image of flow data is generated, providing both velocity and location in a two-dimensional plane.

For a full understanding of how flow data is generated according to the present invention, the following discussion will individually address each of the primary features of the invention—the generation of the NMR signal, the means of achieving spatial selectivity, how the signal is used to detect flow, and the two-dimensional imaging technique. Although several of these features involve known technology, each is reviewed below to place it in proper context and to promote an understanding of the invention in its entirety.

I. NMR Signal Generation

The basic concepts of NMR are well known, as are a variety of techniques for generating NMR signals. Detailed descriptions are found in the literature, notably the text by Farrar and Becker, entitled *Pulse and Fourier Transform NMR—Introduction to Theory and Methods*, Academic Press, New York (1971). The following is a brief summary of this technology as it applies to the present invention.

Certain types of nuclei, by virtue of the number of protons and neutrons therein, have a net magnetic moment which enables them to respond to a magnetic field. The effect of a magnetic field on such nuclei is to cause alignment of the spins in the field direction, or, more precisely, to cause the nuclei to precess about an axis parallel to the field direction. The precession frequency is directly proportional to the intensity of the magnetic field, the proportionality constant being the magnetogyric ratio for the nucleus in question. This relationship is known as the Larmor equation, and the frequency itself is commonly designated the Larmor frequency. The magnetic fields generally used in NMR applications are static and unidirectional, resulting in a nuclear spin alignment which is uniform throughout the object under study.

In addition to being under the influence of a magnetic field, the nuclei of interest are placed within the range of sensitivity of an NMR signal detector. The latter is generally a coil connected to a radio frequency (RF) signal generator and receiver. The coil is appropriately oriented to detect signals emitted by nuclei which have been excited away from the equilibrium state by a particular energy increment. In the configuration generally used, the coil detects a signal only when the net macroscopic magnetization has a component in the plane perpendicular to the direction of the magnetic field. Thus, an energy increment which modifies the nuclear magnetization in this manner will cause a detectable signal to occur.

Excitation is accomplished by irradiating the nuclei with a carrier wave of a characteristic RF generated by the radio frequency signal generator. For maximum effect, the carrier is oriented in a plane perpendicular to the direction of the magnetic field. If the frequency of the carrier is equal or very close to the precession frequency of the nuclei, the latter will undergo a change in angular momentum according to the Bloch equations. The result is a nutation of the nuclear spins away from the axis of the static magnetic field by an amount in accordance with the amplitude of the carrier wave and the length of time it is applied. An irradiation by a carrier wave of a designated amplitude and duration is commonly termed a "pulse."

Due to the orientation of the detector coil, detectable signals are generated only when the spins have been nutated away from their equilibrium direction (the direction of the static magnetic field). The maximum signal will be that resulting from a 90° nutation. In preferred embodiments, therefore, the initial excitation is a pulse which nutates the nuclear spins by approximately 90°.

The initial effect of the irradiation is to cause the magnetic moments of the nuclei to rotate in phase, and thereby generate a detectable signal. The intensity of this signal decays, however, as the moments begin to spread out (dephase) due to both the exchange of energy between neighboring nuclei and nonhomogeneities in the magnetic field. This decay is known as the "free induction decay" (FID) and the time needed for the signal to decay to 1/e or approximately one-third of its initial value is called the $T^*_2$ relaxation time.

The signal can be regenerated, however, by reversing the spins (nutating the spins by 180°) to cause the magnetic moments to rotate in the opposite direction. When so reversed, the spins will pass back through the point where they are all in phase and a signal will reappear in the detector. The intensity of the signal will rise to a maximum at the point where the magnetic moments are precisely in phase, or at least in phase to the highest degree possible. The time interval between this point and the instant at which the spin reversal took place will be equal to the time interval between the initial (signal-generating) nutation and the spin reversal. This regenerated signal is commonly known as the "spin echo."

Further spin echoes can be generated by additional spin reversals. In each case, the spin echo will peak at a time interval following the spin reversal equal to the time interval between the previous spin echo peak and the spin reversal.

During all this time, the torque exerted on the nuclei by the magnetic field tends to realign the nuclei in the direction of the magnetic field. When complete realignment has been regained, the macroscopic magnetization will have returned to its equilibrium value and no signal will appear in the detector. The period of time required for this to happen depends on the particular value of the magnetic moment, and is commonly referred to as the "spin-lattice" or longitudinal relaxation time, with a characteristic time constant commonly designated $T_1$, referring to a decay factor of 1/e. Although the spin-lattice relaxation is asymptotic in character, the time for total relaxation, within the normal limits of detection, will range from about 0.01 to about 20 seconds. A typical $T_1$ value for hydrogen nuclei in the bloodstream is about 700 milliseconds. This time period will generally be considerably longer than the spin-spin relaxation time.

Clearly, as the spin-lattice relaxation becomes more and more advanced, the signals will steadily decrease in intensity. In order to be detectable, therefore, all signals must remain within the spin-lattice relaxation time, and the closer these signals are to the original signal-generating excitation, the stronger and more easily detectable they will be.

For reasons which are explained below, the signal in the present invention must be one which arises from a minimum of two time-spaced nuclear spin excitations. The most common such signals are the spin echo signals, including the first spin echo and subsequent spin echoes. When a first spin echo is used, for example, the two excitations are the initial pulse which generates the FID, and the spin reversal pulse needed for the echo to occur the two pulses being spaced apart by the time interval which also determines when the echo will occur. Emphasis on the signal of interest to the exclusion of the other signals is readily achieved by selecting a particular relaxation time following the last irradiation for emphasis by the signal detector. Detection and emphasis of this kind is normally alone by computer, by incorporation into the imaging program as described in Section IV below.

II. Selectivity

A critical feature of this process is selectivity. The term is applied herein to both irradiation and signal generation, and designates a focusing on a predetermined volume to the exclusion of all others. The selected volume is generally a small portion of the volume of the entire object within the sensitivity range of the detector. Selectivity is needed both to isolate the region of interest and to detect flow through that region by measuring the effect of the flow on the intensity of the signal emanating from that region.

In preferred embodiments of the invention, the selected volume is a tomographic region, extending through the entire cross-section of the object. The terms "planar volume" or "slice" will be used herein as commonly used in the art, to designate such a region. These terms generally denote the volume between two parallel planes wherein the distance between the planes is small in comparison to either transverse dimension in the planes themselves. The result is a flat thin volume of finite thickness.

The designation of a line as "perpendicular to" such a volume will refer herein to a line perpendicular to each of the two planes. "Parallel" planar volumes will designate two or more planar volumes where all of the broad planes are parallel. For purposes of the present invention the thickness of the planar volume is not critical, and can vary widely. For most applications, however, the thickness will generally range from about 0.01 cm to about 50 cm, preferably from about 0.1 cm to about 4 cm.

Methods of achieving a selective excitation are well known. Some techniques are based on the fact that precessing nuclei in a magnetic field will respond only to a transverse carrier wave whose frequency is the same as or close to the precession frequency. Since, as indicated above, the precession frequency is directly proportional to the intensity of the magnetic field, one means of achieving spatial selectivity is by imposing a gradient on the magnetic field so that its intensity varies as a function of position throughout the object. The entire object is then irradiated with a carrier wave having a frequency bandwidth which corresponds to the magnetic field range within the desired spatial region. As a result, only those nuclei within the desired region are affected, and all remaining nuclei are not.

The envelope shape of the carrier wave frequency for such an irradiation is not critical, provided only that it spans the necessary range in a continuous manner. A particularly convenient envelope shape is that defined by the relation $(\sin \omega t)/\omega t$.

When the selected volumes are planar volumes, the field intensity variation takes the form of a simple gradient in the direction perpendicular to the planar volume. For a carrier wave of given bandwidth, the thickness of the planar volume will depend on the magnitude of the magnetic field gradient. The gradient itself can vary widely, depending on the other system parameters and the procedure used, but for most applications will fall within the range of about 0.01 gauss/cm to about 10 gauss/cm, preferably about 0.01 gauss/cm to about 2 gauss/cm.

An undesirable feature of irradiation through a magnetic field gradient is a small degree of dephasing which occurs along the direction of the gradient. This tends to obscure all signals which are generated by excitations during the time period in which the gradient is present. This can be corrected by reversing the gradient after the pulse is applied, to generate an echo of the pulse. By then removing the gradient at the point in time corresponding to the peak of the echo, the pulse effects are brought back into phase. Thus, in general, the duration of the correction gradient will be one-half that of the initial gradient, provided that the gradients are equal and antiparallel and that the carrier wave is on for approximately the entire duration of the initial gradient. Signals occurring at subsequent points in time (such as the spin echo and spin echo replica signals discussed above) are likewise clearly focused.

An alternative to a simple magnetic field gradient for achieving selectivity is the use of a localized variation or discontinuity in the field, such as a "bulge" or "dip" in the field intensity in the region of interest along the axis which is in line with the direction of flow. This can be achieved by using an appropriate combination of coils—e.g., two coils of opposing polarity positioned adjacent each other with a gap in between, or other combinations readily apparent to those skilled in the art. A carrier wave envelope corresponding only to the intensity in the region of the discontinuity will then provide the selectivity. Using this alternative, phase correction of the type mentioned in the preceding paragraph is unnecessary. Other alternatives will be readily apparent to those skilled in the art.

When more than two excitations or pulses are used in the signal generation, selectivity is required only for two of the pulses. Thus, a combination of whole body irradiation (no magnetic field gradient) for some pulses and selective irradiation for others can be used. The various combinations will be readily apparent to those skilled in the art.

III. Flow Detection

As stated above, flow rate detection is achieved by the use of noncoinciding planar volumes for at least two of the volumes into which the excitations necessary for the signal generation are selectably made. The volumes are offset along the direction of flow, to the extent that at least a portion of each of the two volumes lies outside the other. Thus, the two volumes may be either overlapping, contiguous, or separated by a gap. The offset causes the emphasis of signals arising from nuclei flowing from one volume to the other during the time interval between the excitations. The offset can be adjusted to vary the type of measurement or flow information obtained, the degree of accuracy or quantitative character of the resulting data, and the expected range of the result. The offset can be created in a number of ways, depending upon the method used to achieve selectivity. For example, when a magnetic field gradient is used, an appropriately timed modulation of the overall field strength will cause a shift in the location of the region affected by a given carrier wave. Other methods will be readily apparent to those skilled in the art.

As an illustration of the use of nonoverlapping volumes (i.e., contiguous or separated by a gap) in conjunction with the generation of spin echo signals, consider the method whereby the nuclei in one slice (slice A) are nutated by 90°, and at a predetermined time interval thereafter the nuclei in the second slice (slice B) are nutated by 180°. If both slices contain only stationary material, no material in either of the slices will have seen both 90° and 180° nutations, since the slices do not overlap. Therefore, no spin echo signal will be detected. If material has flowed from slice A into slice B during the time interval between the 90° and 180° nutations, then such flowing material will have seen both nutations and will produce a spin echo signal at the appropriate time interval (it will be remembered that the interval between the 180° nutation and the spin echo will be equal to the interval between the 90° and 180° nutations). No other material in the two slices will produce an echo, since none of this material has received both nutations, the necessary prerequisite for a spin echo.

Consider now the same method, except using overlapping slices. The stationary nuclei in the region of overlap will receive both a 90° and a 180° nutation, and therefore produce a spin echo signal. Material present in slice A during the 90° nutation and slice B during the 180° nutation and flowing either into, out of, or across the overlap region will produce an additional signal, adding to the overall signal intensity. This effect may be thought of as a widening of the overlap region. Similarly, material flowing in the opposite direction will cause a reduction in the total signal, since material originally in the overlap region (where it was flipped by 90°) flows away from slice B rather than toward it. This is effectively a narrowing of the overlap region. When combined with two-dimensional imaging as described in Section IV below, the overlap technique is capable of providing an overall layout of blood flow structures, a highly useful piece of information in the study of living animals and the diagnosis and treatment of disease.

In general, the process of the present invention can be used to generate either qualitative or quantitative flow data. Quantitative data can be obtained by relating the intensity of the detected signal to the flow rate. For instance, where the excitation volumes are large in comparison to the average distance traveled by the nuclei during the time interval, the intensity of the signal will increase in proportion to the number of nuclei which exhibit flow regardless of individual velocities. Where the volumes are small in comparison to the average distance traveled, the signals can be isolated for specific velocities or highly defined ranges by appropriate adjustment of the dimensions of both the volumes and the gap.

The process can also be used to generate more detailed information such as, for example, a velocity distribution covering a range of velocities. This is achieved by repeating the process a number of times, each time focusing on a different velocity or velocity range. This can be done in several ways, notably by varying either the degree of offset (e.g., the width of the gap) or the length of the time interval between excitations. The result is a corresponding variation in the range of velocity detectable by the detector for each repetition. The signals from each repetition are then compared or combined to provide a correlation between a particular velocity or velocity range and the proportion of total nuclei moving at such a velocity. The number and range of repetitions are optimally selected to cover the entire velocity distribution within the object under study.

As previously mentioned, the process of the present invention is particularly useful when applied to blood flow measurements in a living animal. Since blood flow is pulsatile in nature, corresponding excitations from one repetition to the next are preferably spaced to occur at the same point in the heart cycle to provide uniformity among the repetitions. This can be accomplished by synchronizing the pulse sequences to an electrocardiogram, a process called "gating".

To illustrate how a velocity distribution may be obtained, two methods will be described. The first (designated "Variant A") produces a series of subsignals each relating to velocities greater than a predetermined threshold velocity, the latter varying from one signal to the next. The second ("Variant B") produces a series of subsignals, each emphasizing velocities within a fairly narrow range close to a predetermined reference velocity, the latter varying from one signal to the next.

Variant A

This technique consists of a series of repetitions each producing a subsignal relating to all nuclei with velocities exceeding a predetermined threshold value. The signal for each repetition is read in binary fashion, and the threshold velocity is varied with each repetition. This is done by using nonoverlapping volumes separated by a gap whose width increases with each successive repetition and thus defines a progressively increasing threshold velocity. The signals are then compared or combined to generate a distribution.

Fundamental to this technique is the appropriate selection of slice thickness and gap width. In order for a subsignal to encompass all velocities exceeding the threshold, the thickness of each volume must be at least as great as the maximum distance traveled by nuclei during the time interval between excitations. Consequently, the gap width must be less than the thickness of the thinnest slice, to ensure that at least some of the nuclei from the first slice will reach the second slice within the time interval and thereby produce a detectable signal. To generate a distribution, there must be a substantial number of repetitions at varying gap widths where each gap width is less than the maximum distance traveled by the nuclei. In preferred embodiments, the gap width in each case is narrow in comparison to the thickness of the slices.

For convenience, the gap width for a given subsignal may be represented by the symbol $S_n$, where $n=(0, 1, 2, \ldots, N-1)$, and N is the total number of repetitions made. The threshold velocity $V_{min}(n)$ for each repetition is then represented by $$V_{min}(n) = (S_n + S_t)/\tau$$

where $S_t$ represents the distance (relatively small) which material from the first slice must flow into the second slice in order to be present in sufficient quantity to produce a signal which is strong enough to be detected unambiguously.

The gap width may be increased from one repetition to the next in any progressive manner capable of translation into a distribution. This can be done either in linear manner (using equal increments) or nonlinear manner (for example, using logarithmically increasing gap distances). A distribution is then developed from these subsignals in a conventional manner, depending on the type of gap width variation used.

The versatility of this technique can be expanded by combining it with a two-dimensional imaging process, several of which are known in the art of NMR signal generation. Further description of this is provided in Section IV below.

Variant B

This technique differs from that of Variant A by selecting volumes and gap widths such that each signal relates to all nuclei moving at or near a reference velocity, the reference velocity differing for each repetition. As in Variant A, this is done through the use of nonoverlapping slices, separated by a gap of width increasing with each repetition, the gap width in each case defining the reference velocity rather than a threshold velocity. Here, however, the thickness of each volume is substantially less than the maximum distance traveled by nuclei during the time interval during excitations. Consequently, the gap widths are all at least as great as the thickness of the thickest slice. A distribution is obtained by using a substantial number of repetitions where the gap width is also less than the maximum distance traveled. Preferably, the gap width is large in comparison to the thickness of the slices.

If the reference velocity is designated $V_{ref}(n)$, detectable velocities V for any given repetition will be those within the range defined by $$(V_{ref}(n) - \delta) < V < (V_{ref}(n) + \delta)$$

As in Variant A, the gap widths from one repetition to the next may vary in either linear or nonlinear fashion, and the technique may be combined with imaging to provide a more versatile and highly detailed set of data.

IV. Two-Dimensional Imaging

As stated above, the process of the present invention is particularly useful in the development of a two-dimensional map of flow data for a specified cross-section of a large object such as a limb, torso, head, etc. This is achieved by combining the methods described above with conventional NMR imaging techniques for providing a two-dimensional signal array.

Any conventional imaging technique capable of providing a two-dimensional array can be used provided, however, that the imaging does not interfere with the flow detection. Thus, only those imaging techniques involving excitation in parallel planar volumes, all selected volumes being perpendicular to the direction of flow, can be used.

One particularly useful technique involves a two-dimensional Fourier transform and is disclosed in the following publications:

Crooks et al., "Nuclear Magnetic Resonance Whole-Body Imager Operating at 3.5 KGauss", *Radiology*, 143(1): 169–174 (1982);

Edelstein et al., "Spin Warp NMR Imaging and Applications to Human Whole-Body Imaging", *Phys. Med. Biol.*, 25(4): 751–6 (1980);

Kumar et al., "NMR Fourier Zeugmatography", *J. Mag. Res.*, 18: 69–83 (1975).

Briefly, this imaging technique provides position discrimination in one direction within the plane by imposing a magnetic field gradient in that direction during the period of time when the spin echo or spin echo replica signals (whichever are to be used for the measurement) will occur. The total signal will then cover a range of frequencies which can be broken down into its components by Fourier transform treatment, and each component then translated into a position along the axis in this first direction. Discrimination along the second direction, perpendicular to the first, is achieved by imposing a magnetic field gradient in the second direction, at some point in time during the pulse sequence prior to the signal occurrences, for a preset period of time. This places the spins out of phase with each other by an amount proportional to the position along the Y direction. The entire procedure is repeated a number of times, each time varying the degree to which the spins are placed out of phase. This is done either by varying the time during which the gradient is applied, varying the magnitude of the gradient, or using similar techniques which are readily apparent to those skilled in the art. The signals from each of these repetitions are totalled for each unit of length in the first direction. Any signals which occur will then go in and out of phase at a rate depending on the degree of phase spread. This frequency is then translated by Fourier transform to a position along the second direction. The final result of the two-dimensional Fourier transform is a rectangular array of signals. Clearly, the number of pixels in the array is not critical provided that it provides sufficient resolution for the area in which measurement is desired. For digital equipment, a convenient array is a square having 128 (or some other power of two) elements in each direction.

Using further known computational techniques, signals for a specific area within the rectangular array can be isolated and totalled. This method permits determination of flow data for specific areas of interest. This method, which is a simple extrapolation of general imaging procedures, uses specific "tailored" frequency bands to image specific regions with tailored magnetic field regions.

When imaging is applied to the distribution-generating technique mentioned above, the individual repetitions become sub-images. Thus, when the time interval between the pulses is varied from one repetition to the next, an entire two-dimensional image is generated for each time interval. Similarly, when the gap width is varied, an entire two-dimensional image is generated for each gap width. These sub-images may then be combined in any of several ways, to produce a highly accurate two-dimensional image of the planar volume, which displays the entire range of flow velocities being measured.

When a distribution is generated from a series of sub-images, each sub-image is preferably in binary form. Applying this technique to Variant A above, for example, each sub-image will consist of a two-dimensional array of pixels, those pixels where the average velocity exceeds $V_{min}(n)$ appearing "white", and all others appearing "black." Similarly for Variant B, all pixels where the average velocity falls between $V_{ref}(n) - \delta$ and $V_{ref}(n) + \delta$ will appear white, and all other pixels will appear black.

Once a sufficient number of binary sub-images have been acquired to span the entire range of flow rates, the data from the sub-images may either be examined on an individual basis or combined to produce a full range flow image. The latter is readily achieved according to conventional methods. The particular method used will depend on the form and style of flow representation desired in the final image. Examples of these techniques are offered in the attached drawings.

FIG. 1 illustrates the development of a full range flow image using the technique of Variant A. The planar volume being imaged in this Figure is a tomographic slice designated by the numeral 1. In this slice are three flow regions (or "tubes"), the material in the leftmost tube 1 having the slowest flow rate, that in the middle tube 2 having a medium flow rate, and that in the rightmost tube 3 having the fastest flow rate. A total of N binary sub-images is produced, ranging from n=0 to n=N−1. Note that the flow in each tube is laminar in character, rather than plug flow. It is assumed that the cross section of each tube spans a sufficient number of pixels to give a reasonably accurate representation of the tube's shape.

The first repetition, corresponding to n=0, is shown in section (a) of the figure. The lower portion of this section is a side elevational view of slices 4 and 5, the first representing the volume where the selective 90° nutation takes place, and the second representing the volume where the selective 180° nutation takes place. It will be noted that the gap width between the volumes is zero, and that the portion of each tube extending into slice 5 is parabolic in shape, representing the material originally in slice 4 but having flowed in laminar fashion into slice 5 during the time interval between the nutations. A small portion of slice 5 along its lower boundary is designated by the numeral 6, and represents the small distance through which material from slice 4 must flow into slice 5 in order to be present in sufficient quantity to produce an unambiguous signal (referred to above as $S_t$). The upper portion of section (a) is a plan view of the sub-image 7 obtained by a conventional imaging technique as described above. Since this corresponds to n=0, this sub-image (binary in character) will be designated herein as BS(0). The white regions 8 in the sub-image are those pixels from which a signal was read.

Sections (b) and (c) of FIG. 1 represent subsequent repetitions and the resulting sub-images, BS(1) and BS(2), respectively, which are generated using the same interpulse time interval as that used in BS(0) but with a linearly increasing gap width, generally designated $S_n$. Clearly, the gap width in each case (in conjunction with $S_t$) defines a minimum velocity, and as the minimum velocity increases with successive images, the number of pixels in the image which appear white decreases. In the final image, shown in section (d) of the drawing, BS(N−1), the gap width exceeds the maximum distance traveled by nuclei in slice 4 and none of the pixels in the image appear white.

The material in tube 1 generates a detectable signal only in BS(0). For tube 2, however, the center pixels show white for the first two subimages. The flow along the outer rim is slower, however, and thus only the first sub-image shows white for these pixels. Similarly, tube 3 contains a central region appearing white in each of the first three sub-images, surrounded by an intermediate ring of a somewhat lesser flow rate which appears white in only the first two sub-images, and finally an exterior ring which appears white in only the first sub-image.

the final image is shown in section (e) of the figure and represents a combination of all sub-images. Intensity values are assigned to each pixel to correspond to the highest binary sub-image for which that pixel is white. Thus, the background of the image, representing nonflowing nuclei, has an intensity value of 0, tube 1 and the outermost rings of tubes 2 and 3 each have an intensity value of 1, the center of tube 2 and the intermediate ring of tube 3 each have an intensity value of 2, and the center of tube 3 has an intensity value of 3.

An alternative to simply assigning intensity values based on the number of the highest sub-image for which a given pixel appears white is to assign an intensity value of "1" for each white pixel and "0" for each black pixel and sum together all N sub-images. Each pixel will then have an intensity value ranging from 0 to N.

Each of these methods can be used for either linear or nonlinear (e.g., logarithmic) displays. In the latter case, it may be necessary to multiply each of the sub-images by a predetermined weighting factor before summing the images.

An alternative to using intensity values to distinguish velocities is the use of different colors. Other variations will be readily apparent to those skilled in the art.

The images discussed above display velocity as a function of position in the X-Y plane. For some applications, however, a simple velocity distribution (i.e., a plot of velocity versus proportion of the total cross-sectional area exhibiting that velocity) may be desired for a specific region in the plane of interest. Such a plot is readily created from any region of a two-dimensional image by merely counting pixels within the region of interest to determine the number having a specific intensity value. When such counting is done for each of the N intensity values, the result is a flow distribution function indicating the number of pixels, and hence the proportion of the total area of the region, exhibiting each intensity value.

Figure 2:
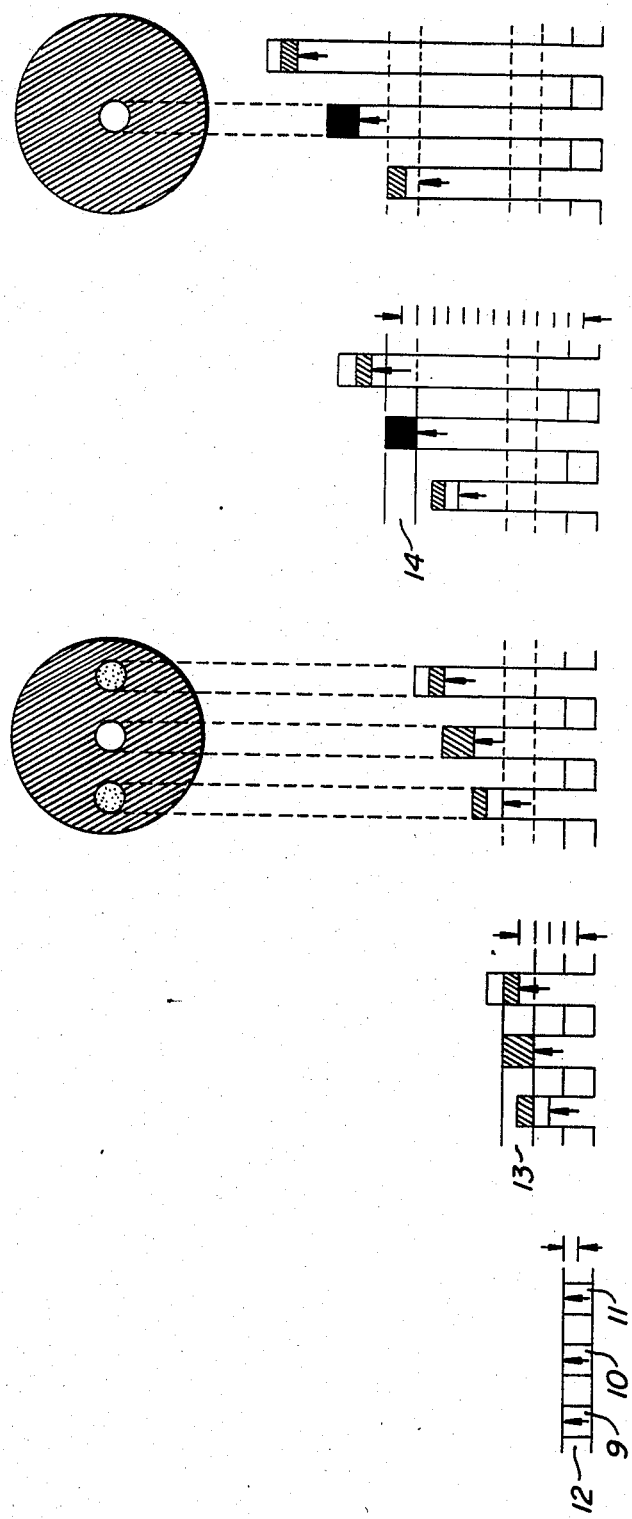
FIG. 2 is an illustration of a second embodiment of the invention, whereby data similar to that obtained by the embodiment of FIG. 1 is obtained, although by an alternative technique.

FIG. 2 illustrates an application of Variant B. Here the slices are relatively thin, and are separated by a gap generally designated $S_n$, measured between the centers of the slices. Three flow tubes are shown (9, 10 and 11), each having "plug flow," with slow, medium, and fast velocities, respectively.

Section (a) of the figure illustrates the 90° nutation, showing the slice selectively excited thereby (designated 12) at time t=0. Section (b) represents the point in time corresponding to $t=\tau$, when slice 13 is given a 180° nutation. The center-to-center distance, $S_n$, between the slices is equal to four spatial divisions (where one spatial division is the distance from the center of each slice to its surface). Thus, only that material flowing at or near a rate of four spatial divisions per time interval $\tau$ (as in tube 10) will have received both the 90° and 180° nutations. Slower flowing material (e.g., 2 divisions/$\tau$) will not reach slice 13 in time for the 180° nutation, and faster flowing material (e.g., 6 divisions/$\tau$) will have flowed through and passed slice 13 during time $\tau$, missed the 180° nutation, and thereby generated no signal.

Section (c) represents the point in time (at $t=2\tau$) at which the spin echo signals are generated. Note that all of the material in tube 10, flowing at four divisions/$\tau$ receives the 180° nutation. Tube 10 therefore produces a strong echo signal at time $2\tau$. By contrast, only half of the flowing material in each of tubes 9 and 11 receives the 180° nutation. The echo signals produced by these tubes therefore have only half the amplitude of that of tube 10.

The selectivity of the method can be greatly improved by eliciting a second spin echo and using it rather than the first spin echo to form the sub-image. The second spin echo is generated by applying a second 180° nutation at a later time period, as shown in section (d) of FIG. 2. The second 180° nutation is made at a time $t=3\tau$, and restricted to a third slice (numeral 14) located further along the flow direction. At this point in time, the flowing material in the three tubes is spread further apart, and only the material in tube 10 receives all three excitations. When the second spin echo occurs, at time $t=4\tau$ (section (e) of the figure), a single image of full intensity is obtained, relating only to tube 10, which is flowing at a velocity of 4 divisions/$\tau$.

As in Variant A, a series of binary sub-images is produced by varying the gap width from one repetition to the next. Once the full range of sub-images has been acquired, the data may be combined to produce a full range flow image in a conventional manner, for example either of the two techniques mentioned above in regard to FIG. 1, depending on the form and style of flow representation desired in the final image.

The method described herein can be performed on conventional apparatus known and presently used for medical imaging by NMR. Extensive descriptions of such apparatus are to be found in the two Crooks et al. patents referenced above (nos. 4,297,637 and 4,318,043), and the references cited therein, as well as Crooks et al., "Nuclear Magnetic Resonance Whole-Body Imager Operating at 3.5 KGauss," *Radiology*, 143(1): 169–174 (1982), and the references cited therein. Each of these documents is incorporated herein by reference.

The foregoing description is offered primarily for purposes of illustration. While a variety of embodiments have been disclosed, it will be readily apparent to those skilled in the art that numerous modifications and variations not mentioned herein can still be made without departing from the spirit and scope of the invention as claimed hereinbelow.

What is claimed is:

1. A method for generating a detectable signal related to the linear displacement, in a predetermined direction, of nuclei within an object under the influence of a magnetic field and within the range of sensitivity of an NMR detector, comprising:
   (a) aligning the spins of said nuclei with said magnetic field;
   (b) exciting said nuclei to generate in said detector a signal of the type requiring a plurality of discrete excitations at least two of which are separated by a predetermined time interval of finite duration, by confining two of said separated excitations to a first selected planar volume and a second selected planar volume, respectively, both of which are substantially perpendicular to said predetermined direction and laterally coextensive with each other, with at least a portion of each said volume lying outside the other along said predetermined direction; and
   (c) detecting the presence of said signal as an indication of the movement of nuclei from said first planar volume to said second planar volume during said predetermined time interval.

2. The method of claim 1 wherein said first and second planar volumes overlap.

3. The method of claim 1 wherein said first and second planar volumes do not overlap, and occupy positions relative to each other which range from being contiguous to being separated by a gap of width equal to the maximum displacement, in said predetermined direction during said predetermined time interval, of nuclei excited in step (b).

4. The method of claim 1 wherein steps (a) through (c) are repeated in sequence at least once, each time varying the duration of said predetermined time interval.

5. The method of claim 4 wherein steps (a) through (c) are repeated in sequence a sufficient number of times to produce an indication of the linear displacement rate distribution over at least a substantial portion of the full range of said rates occurring among nuclei in said first planar volume.

6. The method of claim 1 wherein steps (a) through (c) are repeated in sequence at least once, each time varying the location of each said planar volume relative to the other.

7. A method for generating a detectable signal related to the linear displacement, in a predetermined direction, of nuclei within an object under the influence of a static unidirectional magnetic field and within the range of sensitivity of an NMR detector oriented to detect only the component of magnetization lying in the plane perpendicular to the direction of said magnetic field, said method comprising:

(a) aligning the spins of the nuclei within said object along the direction of said magnetic field, (b) selectively exciting a first planar volume within said object and substantially perpendicular to said predetermined displacement direction to nutate the nuclear spins of nuclei within said volume by a predetermined angle capable of generating a signal detectable by said detector, (c) reversing the spins of nuclei within said object at least once at predetermined time intervals sufficiently soon after the excitation of step (b) to produce spin echo signals, the last of said reversals being confined to a second planar volume by selective excitation thereof, said second planar volume being substantially parallel to and laterally coextensive with said first planar volume, and at least a portion of each of said first and second planar volumes lying outside the other, and (d) detecting the presence of spin echo signals from said object corresponding to the last of said reversals at times in accordance with said predetermined time interval.

8. The method of claim 7 wherein said predetermined angle is approximately 90°.

9. The method of claim 7 wherein the spin echoes of step (d) are either first or second spin echoes.

10. The method of claim 7 wherein said first and second planar volumes overlap and the spin echoes of step (d) are first spin echoes.

11. The method of claim 7 wherein said first and second planar volumes are separated by a gap and steps (a) through (c) are repeated at least once, each time varying the duration of said predetermined time interval.

12. The method of claim 7 wherein said first and second planar volumes are separated by a gap and steps (a) through (c) are repeated at least once, each time varying the width of said gap.

13. A method for generating a detectable signal related to the distribution of rates of linear displacement, in a predetermined direction, of nuclei within an object under the influence of a static unidirectional magnetic field and within the range of sensitivity of an NMR detector oriented to detect only the component of magnetization lying in the plane perpendicular to the direction of said magnetic field, said method comprising:

(a) aligning the spins of the nuclei within said object along the direction of said magnetic field, (b) selectively exciting a first planar volume within said object, substantially perpendicular to said predetermined displacement direction, to nutate the nuclear spins of nuclei within said volume by a predetermined angle capable of generating a signal detectably by said detector, (c) selectively exciting a second planar volume within said object to reverse the spins of nuclei therein, at a predetermined time interval sufficiently soon after the excitation of step (b) to produce spin echo signals thereof, said second planar volume being substantially parallel to and laterally coextensive with said first planar volume, said first and second planar volumes each having a thickness at least as great as the maximum displacement, in said predetermined direction during said predetermined time interval, of nuclei nutated in step (b), and separated from each other by a gap of width not greater than the thickness of the thinnest of said first and second planar volumes, (d) detecting the presence of spin echo signals from said object at times in accordance with said predetermined time interval, and (e) repeating steps (a), (b), (c), and (d) in sequence, each time using the same first planar volume, the same predetermined time interval, and a different second planar volume, said gap width varying with each said repetition, a sufficient number of times at gap widths less than said maximum displacement to produce an indication of the linear displacement rate distribution over at least a substantial portion of the full range of linear displacement rates of the nuclei nutated in step (b).

14. The method of claim 13 wherein said predetermined angle is approximately 90°.

15. The method of claim 13 wherein the thickness of each of said first and second planar volumes is approximately equal to the maximum displacement, in said predetermined direction during said predetermined time interval, of nuclei nutated in step (b).

16. The method of claim 13 wherein the gap widths progressively increase with each repetition of step (e) by equal increments from one repetition to the next.

17. The method of claim 13 wherein the gap widths increase with each repetition of step (e) in logarithmic progression.

18. The method of claim 13 wherein the repetitions of step (e) are sufficient in number to encompass substantially the full range of linear displacement rates of the nuclei nutated in step (b).

19. The method of claim 13 wherein said object is a living animal, said linear displacement rates are blood flow rates, and the repetitions of step (e) are timed such that each occurs at the same point in the heart cycle.

20. A method for generating a detectable signal related to the distribution of rates of linear displacement, in a predetermined direction, of nuclei within an object under the influence of a static unidirectional magnetic field and within the range of sensitivity of an NMR detector oriented to detect only the component of magnetization lying in the plane perpendicular to the direction of said magnetic field, said method comprising:

(a) aligning the spins of nuclei within said object along the direction of said magnetic field, (b) selectively exciting a first planar volume within said object, substantially perpendicular to said predetermined displacement direction, to nutate the nuclear spins of nuclei within said volume by a predetermined angle capable of generating a signal detectable by said detector, (c) selectively exciting a second planar volume within said object to reverse the spins of nuclei therein, at a predetermined time interval sufficiently soon after the excitation of step (b) to produce spin echo signals thereof, said second planar volume being substantially parallel to and laterally coextensive with said first planar volume, said first and second planar volumes each having a thickness substantially less than the maximum displacement, in said predetermined direction during said predetermined time interval, of nuclei nutated in step (b), and separated from each other by a gap of width at least as great as the thickness of the thickest of said first and second planar volumes, (d) detecting the presence of spin echo signals from said object at times in accordance with said predetermined time interval, and (e) repeating steps (a), (b), (c), and (d) in sequence, each time using the same first planar volume, the same predetermined time interval, and a different second planar volume, said gap width varying with each said repetition, a sufficient number of times at gap widths less than said maximum displacement to produce an indication of the linear displacement rate distribution over at least a substantial portion of the full range of linear displacement of the nuclei nutated in step (b).

21. The method of claim 20 wherein said predetermined angle is approximately 90°.

22. The method of claim 20 wherein said first and second volumes are of approximately equal thickness.

23. The method of claim 20 further comprising reversing the spins of at least a substantial portion of the nuclei nutated in step (b), at least once between the excitations of steps (b) and (c), and in which the spin echo signals of step (d) are second or subsequent spin echo signals.

24. The method of claim 20 wherein the gap widths progressively increase with each repetition of step (e) by equal increments from one repetition to the next.

25. The method of claim 20 wherein the gap widths increase with each repetition of step (e) in logarithmic progression.

26. The method of claim 20 wherein the repetitiona of step (e) are sufficient in number to encompass substantially the full range of linear displacement rates of the nuclei nutated in step (b).

27. The method of claim 20 wherein said object is a living animal, said linear displacement rates are blood flow rates, and the repetitions of step (e) are timed such that each occurs at the same point in the heart cycle.

28. The method of claims 1, 7, 13 or 20 wherein each said selective excitation comprises:

modulating said magnetic field to produce a position variant field intensity whereby the intensity at all points within said predetermined volume falls within a predetermined range and the intensity at all other points falls outside said range, and irradiating said object with a carrier having a frequency bandwidth equal to the Larmor frequency bandwidth corresponding to said predetermined field intensity range.

29. The method of claims 1, 7, 13 or 20 wherein each said selective excitation comprises:

modulating said magnetic field to produce a field intensity gradient perpendicular to the planar volume so excited, whereby the intensity at all points within said volume falls within a predetermined range and the intensity at all other points falls outside said range, and irradiating said object with a carrier having a frequency bandwidth equal to the Larmor frequency bandwidth corresponding to said predetermined field intensity range.

30. The method of claim 29 wherein said gradient is from about 0.01 gauss/cm to about 10 gauss/cm.

31. The method of claim 29 wherein said gradient is from about 0.01 gauss/cm to about 2 gauss/cm.

32. The method of claims 1, 7, 13 or 20 wherein said magnetic field is oriented substantially perpendicular to said displacement direction.

33. The method of claims 1, 7, 13 or 20 wherein said magnetic field is oriented substantially parallel to said displacement direction.

34. The method of claims 1, 7, 13 or 20 wherein said detected signals are two-dimensional arrays of picture elements generated by an NMR imaging technique.

35. The method of claims 1, 7, 13 or 20 wherein said magnetic field is oriented substantially parallel to said displacement direction.

36. A method for generating a series of detectable signals related to the distribution of rates of linear displacement, in a predetermined direction, of nuclei in a plane perpendicular to said displacement direction inside an object under the influence of a static unidirectional magnetic field aligned parallel to said displacement direction and within the range of sensitivity of an NMR detector oriented to detect only those components of nuclear magnetization lying perpendicular to the direction of said magnetic field, said method comprising:

(a) aligning the spins of the nuclei within said object in the direction of said magnetic field, (b) modulating said magnetic field, for a first time period, to produce a field intensity gradient parallel to said displacement direction, whereby the field intensity at all points within a first predetermined planar volume encompassing said plane and perpendicular to said gradient falls within a predetermined range and the intensity at all other points falls outside said range, (c) irradiating said object during said first time period with a carrier having a frequency bandwidth equal to the Larmor frequency bandwidth corresponding to said predetermined field intensity range, to nutate the spins of nuclei within said volume by approximately 90°, (d) modulating said magnetic field for a second time period following said first time period, to produce a field intensity gradient perpendicular to said displacement direction and thereby vary the rate of precession of the nuclei in said object in the direction of said gradient to produce a phase shift in a predetermined fixed proportion to the position of said nuclei in the direction of said gradient, (e) repeating step (b) for a third time period following said second time period, using a gradient of either the same or a different magnitude and an average field intensity of either the same or a different magnitude as that of step (b), (f) irradiating said object, during said third time period, at a first predetermined time interval sufficiently soon after the irradiation of step (c) to produce spin echo signals thereof, with a carrier having a frequency bandwidth equal to the Larmor frequency bandwidth corresponding to the field intensity range of a second predetermined planar volume, to reverse the spins of nuclei within said second planar volume, said second planar volume being substantially parallel to and laterally coextensive with said first planar volume, said first and second planar volumes each having a thickness at least as great as the maximum displacement, in said predetermined direction during said predetermined time interval, of nuclei nutated in step (c), and separated from each other by a gap of width not greater than the thickness of the thinnest of said first and second planar volumes, (g) modulating said magnetic field, during the occurrence of said spin echo signals, to produce a field intensity gradient perpendicular to both the gradient of step (b) and the gradient of step (d), (h) determining the relative intensities of said spin echo signals for a plurality of frequency components, and relating the frequency of each said component to a corresponding magnetic field intensity along the direction of the gradient of step (g) according to the Larmor equation, (i) repeating steps (a) through (h) in sequence at least once, each time varying only the predetermined fixed proportion of step (d), and relating, for each component of step (h), the frequency of the spin echo signal for each repetition to a corresponding phase shift along the direction of the gradient of step (d), and (j) repeating steps (a) through (i) in sequence, each time using the same first planar volume, the same predetermined time interval, and a different second planar volume, said gap width varying with each said repetition, a sufficient number of times at gap widths less than said maximum displacement to produce an indication of the linear displacement rate distribution over at least a substantial portion of the full range of linear displacement rates of the nuclei nutated in step (b).

37. A method for generating a series of detectable signals related to the distribution of rates of linear displacement, in a predetermined direction, of nuclei in a plane perpendicular to said displacement direction inside an object under the influence of a static unidirectional magnetic field aligned either parallel to or perpendicular to said displacement direction and within the range of sensitivity of an NMR detector oriented to detect only those components of nuclear magnetization lying perpendicular to the direction of said magnetic field, said method comprising:

(a) aligning the spins of the nuclei within said object in the direction of said magnetic field, (b) modulating said magnetic field, for a first time period, to produce a field intensity gradient parallel to said displacement direction, whereby the field intensity at all points within a first predetermined planar volume encompassing said plane and perpendicular to said gradient falls within a predetermined range and the intensity at all other points falls outside said range, (c) irradiating said object during said first time period with a carrier having a frequency bandwidth equal to the Larmor frequency bandwidth corresponding to said predetermined field intensity range, to nutate the spins of nuclei within said volume by approximately 90°, (d) modulating said magnetic field for a second time period following said first time period, to produce a field intensity gradient perpendicular to said displacement direction and thereby vary the rate of precession of the nuclei in said object in the direction of said gradient to produce a phase shift in a predetermined fixed proportion to the position of said nuclei in the direction of said gradient, (e) repeating step (b) for a third time period following said second time period, using a gradient of either the same or a different magnitude and an average field intensity of either the same or a different magnitude as that of step (b), (f) irradiating said object, during said third time period, at a first predetermined time interval sufficiently soon after the irradiation of step (c) to produce spin echo signals thereof, with a carrier having a frequency bandwidth equal to the Larmor frequency bandwidth corresponding to the field intensity range of a second predetermined planar volume, to reverse the spins of nuclei within said second planar volume, said second planar volume being substantially parallel to and laterally coextensive with said first planar volume, said first and second planar volumes each having a thickness substantially less than the maximum displacement, in said predetermined direction during said predetermined time interval, of nuclei nutated in step (c), and separated from each other by a gap of width at least as great as the thickness of the thickest of said first and second planar volumes, (g) modulating said magnetic field, during the occurrence of said spin echo signals, to produce a field intensity gradient perpendicular to both the gradient of step (b) and the gradient of step (d), (h) determining the relative intensities of said spin echo signals for a plurality of frequency components, and relating the frequency of each said component to a corresponding magnetic field intensity along the direction of the gradient of step (g) according to the Larmor equation, (i) repeating steps (a) through (h) in sequence at least once, each time varying only the predetermined fixed proportion of step (d), and relating, for each component of step (h), the frequency of the spin echo signal for each repetition to a corresponding phase shift along the direction of the gradient of step (d), and (j) repeating steps (a) through (i) in sequence, each time using the same first planar volume, the same predetermined time interval, and a different second planar volume, said gap width varying with each said repetition, a sufficient number of times at gap widths less than said maximum displacement to produce an indication of the linear displacement rate distribution over at least a substantial portion of the full range of linear displacement rates of the nuclei nutated in step (b).

38. The method of claims 36 or 37 further comprising reversing the magnetic field gradient after one or more of said first and third time periods, and maintaining said reversed gradient for a sufficient period of time to substantially reduce any dephasing occurring along the direction of the gradient during said time period.

39. The method of claims 36 or 37 wherein said nuclei are hydrogen ions in the blood stream of a living animal or human.

40. A method for generating a series of detectable signals related to the distribution of rates of linear displacement, in a predetermined direction, of nuclei in a plane perpendicular to said displacement direction inside an object under the influence of a static unidirectional magnetic field aligned perpendicular to said displacement direction and within the range of sensitivity of an NMR detector oriented to detect only those components of nuclear magnetization lying perpendicular to the direction of said magnetic field, said method comprising:

(a) aligning the spins of the nuclei within said object in the direction of said magnetic field,
(b) modulating said magnetic field, for a first time period, to produce a field intensity gradient parallel to said displacement direction, whereby the field intensity at all points within a first predetermined planar volume encompassing said plane and perpendicular to said gradient falls within a predetermined range and the intensity at all other points falls outside said range,
(c) irradiating said object during said first time period with a carrier having a frequency bandwidth equal to the Larmor frequency bandwidth corresponding to said predetermined field intensity range, to nutate the spins of nuclei within said volume by approximately 90°,
(d) modulating said magnetic field for a second time period following said first time period, to produce a field intensity gradient perpendicular to said displacement direction and thereby vary the rate of precession of the nuclei in said object in the direction of said gradient to produce a phase shift in a predetermined fixed proportion to the position of said nuclei in the direction of said gradient,
(e) repeating step (b) for a third time period following said second time period, using a gradient of either the same or a different magnitude and an average field intensity of either the same or a different magnitude as that of step (b),
(f) irradiating said object, during said third time period, at a first predetermined time interval sufficiently soon after the irradiation of step (c) to produce spin echo signals thereof, with a carrier having a frequency bandwidth equal to the Larmor frequency bandwidth corresponding to the field intensity range of a second predetermined planar volume, to reverse the spins of nuclei within said second planar volume, said second planar volume being substantially parallel to and laterally coextensive with said first planar volume, said first and second planar volumes each having a thickness at least as great as the maximum displacement, in said predetermined direction during said predetermined time interval, of nuclei nutated in step (c), and separated from each other by a gap of width not greater than the thickness of the thinnest of said first and second planar volumes,
(g) modulating said magnetic field, during the occurrence of said spin echo signals, to produce a field intensity gradient perpendicular to both the gradient of step (b) and the gradient of step (d),
(h) determining the relative intensities of said spin echo signals for a plurality of frequency components, and relating the frequency of each said component to a corresponding magnetic field intensity along the direction of the gradient of step (g) according to the Larmor equation,
(i) repeating steps (a) through (h) in sequence at least once, each time varying only the predetermined fixed proportion of step (d), and relating, for each component of step (h), the frequency of the spin echo signal for each repetition to a corresponding phase shift along the direction of the gradient of step (d), and
(j) repeating steps (a) through (i) in sequence, each time using the same first planar volume, the same predetermined time interval, and a different second planar volume, said gap width varying with each said repetition, a sufficient number of times at gap widths less than said maximum displacement to produce an indication of the linear displacement rate distribution over at least a substantial portion of the full range of linear displacement rates of the nuclei nutated in step (b).

* * * * *